US011731418B2

(12) United States Patent
Cleare

(10) Patent No.: US 11,731,418 B2
(45) Date of Patent: Aug. 22, 2023

(54) INKJET PRINTHEAD DRIVE CIRCUIT

(71) Applicant: Inca Digital Printers Limited, Cambridge (GB)

(72) Inventor: Hamilton Buchanan Cleare, Cambridge (GB)

(73) Assignee: AGFA NV, Mortsel (BE)

( * ) Notice: Subject to any disclaimer, the term of this patent is extended or adjusted under 35 U.S.C. 154(b) by 84 days.

(21) Appl. No.: 17/371,694

(22) Filed: Jul. 9, 2021

(65) Prior Publication Data

US 2022/0009227 A1 Jan. 13, 2022

(30) Foreign Application Priority Data

Jul. 10, 2020 (GB) ...................................... 2010688

(51) Int. Cl.
*B41J 2/045* (2006.01)
*H03K 17/687* (2006.01)
*H10N 30/80* (2023.01)

(52) U.S. Cl.
CPC ....... *B41J 2/04541* (2013.01); *B41J 2/04548* (2013.01); *B41J 2/04573* (2013.01); *B41J 2/04581* (2013.01); *H03K 17/6871* (2013.01); *H10N 30/802* (2023.02)

(58) Field of Classification Search
CPC .................................................. B41J 2/04548
See application file for complete search history.

(56) References Cited

U.S. PATENT DOCUMENTS

| 4,498,089 A | 2/1985 | Scardovi |
| 5,361,013 A * | 11/1994 | Wiget .................. H02N 2/0075 310/317 |
| 6,398,331 B1 * | 6/2002 | Asaka .................. B41J 2/04541 347/14 |

(Continued)

FOREIGN PATENT DOCUMENTS

| JP | S63130357 A | 6/1998 |
| JP | 2002036534 A | 2/2002 |

(Continued)

OTHER PUBLICATIONS

The extended European search report, Application No. 21184833.8, dated Dec. 6, 2021.

(Continued)

*Primary Examiner* — Shelby L Fidler
(74) *Attorney, Agent, or Firm* — MacMillan, Sobanski & Todd, LLC

(57) ABSTRACT

A drive circuit for charging a printhead for ejecting drops of ink is provided, the printhead having a capacitance. The drive circuit comprises a power supply comprising a first connection and a second connection. An inductor is connected to the first connection of the power supply, wherein the inductor is connected to a first drive connection of the printhead to provide a charge path for current to charge the capacitance. The second connection of the power supply is connected to a second drive connection of the printhead. The drive circuit also comprises means for applying a plurality of charging voltage pulses to the inductor to provide a single charge of the capacitance for a single cycle of ink ejection from the printhead. A method of operating the drive circuit is also provided.

17 Claims, 5 Drawing Sheets

(56) References Cited

U.S. PATENT DOCUMENTS

| | | | |
|---|---|---|---|
| 2002/0057936 A1* | 5/2002 | Shirotori | B41J 2/30 400/118.3 |
| 2008/0170090 A1* | 7/2008 | Oshima | B41J 2/04541 347/10 |
| 2010/0045714 A1 | 2/2010 | Ishizaki | |
| 2013/0194833 A1* | 8/2013 | Penberth | B41J 2/04581 363/21.04 |
| 2014/0253187 A1 | 9/2014 | Tabata et al. | |
| 2015/0015627 A1* | 1/2015 | Cleare | B41J 2/04548 347/9 |
| 2015/0069934 A1* | 3/2015 | Gardner | B41J 2/04581 318/116 |
| 2020/0164634 A1 | 5/2020 | Lamb | |

FOREIGN PATENT DOCUMENTS

| | | | |
|---|---|---|---|
| JP | 2007118307 A | 5/2007 | |
| JP | 2018103419 A | 7/2018 | |
| WO | 2019145903 A1 | 8/2019 | |

OTHER PUBLICATIONS

Intellectual Property Office Combined Search and Examination Report under Sections 17 and 18(3), Application No. GB2010688.6, dated Jan. 7, 2021.

* cited by examiner

INKJET PRINTHEAD DRIVE CIRCUIT

FIELD

The present disclosure relates to a drive circuit for an inkjet printer, and to a method of operating the drive circuit.

BACKGROUND

Conventional inkjet printers comprise printheads having piezoelectric actuators for each nozzle. Each of these has an inherent capacitance and can be rapidly charged and discharged to eject droplets of ink. To do this, a voltage pulse is typically applied to charge the printhead capacitance to cause the printhead nozzles to dispense droplets of ink. Typically, a single voltage pulse is applied directly to the printhead capacitance in order to provide the charge.

The shape of the voltage pulse can affect droplet uniformity and hence print quality. It is therefore desirable to have control over the shape of the pulse. As the capacitance also changes with the number of active nozzles (the number of nozzles printing), it is also beneficial to have control over the pulse shape to provide a consistent pulse voltage.

Significant power is dissipated in high-speed printhead drive circuits, leading to energy wastage and cooling problems. In systems driving large arrays of printheads, the power dissipation can be significant, requiring large power supplies to provide the energy and large heatsinks to dissipate the waste heat. This dissipation can be the limiting factor on print frequency and duty cycle, limiting performance.

The present application seeks to address one or more of the above problems.

SUMMARY OF SELECTED EXAMPLES

Aspects of the present invention are set out in the independent claims, while preferred features are set out in the dependent claims.

According to a first aspect of the present disclosure, there is provided a drive circuit for charging a printhead for ejecting drops of ink, the printhead having a capacitance, the drive circuit comprising: a power supply comprising a first connection and a second connection; an inductor connected to the first connection of the power supply; wherein the inductor is connected to a first drive connection of the printhead to provide a charge path for current to charge the capacitance; wherein the second connection of the power supply is connected to a second drive connection of the printhead; and means for applying a plurality of charging voltage pulses to the inductor to provide a single charge of the capacitance for a single cycle of ink ejection from the printhead.

The drive circuit provides a plurality of charging voltage pulses to the inductor, whereas the capacitance of the printhead receives a single charging voltage pulse for ink ejection. Therefore, the printhead receives a single charging voltage pulse from the inductor. The plurality of pulses to the inductor allow for control over the shape of the pulse to the capacitance.

In a printhead having a plurality of nozzles for ejecting ink, the number of nozzles that are currently printing may be referred to as the active nozzles. Each of the nozzles has an individual capacitance, where the printhead capacitance is determined by the sum of the capacitances of the nozzles. The number of active nozzles therefore determines the printhead capacitance for that cycle of ink ejection. In other words, the printhead capacitance may vary depending on the image to be printed, and thus on the number of active nozzles. The drive circuit of the present application generates a stable pulse shape for varying loads (varying printhead capacitances), with reduced power consumption by charging and discharging the printhead capacitance using an inductor connected to a half bridge circuit.

In this manner, a plurality of charging voltage pulses are provided to the inductor so that the plurality of charging voltage pulses together provide a single charge of the capacitance. This is to be differentiated from the conventional method of providing a single charging voltage pulse to provide a single charge of the capacitance (i.e. a one to one correspondence), and therefore from the situation where a plurality of pulses are used to provide a plurality of distinct charges of the capacitance (still a one to one correspondence). In contrast, the single charge of the capacitance disclosed herein is provided by the plurality of charging voltage pulses. In other words, each of the charging voltage pulses contributes a portion of the full charge (i.e. less than the full charge). Each charging voltage pulse contributes to the same single charge of the capacitance. The charge cumulatively increases with each charging voltage pulse of the plurality of charging voltage pulses. This allows the capacitance to be charged once using a plurality of charging voltage pulses.

In one example, the first connection of the power supply may be at the supply voltage (e.g. 48 V), and the second connection of the power supply may be at the ground voltage (e.g. 0 V).

In other words, the drive circuit may be configured to apply a plurality of charging voltage pulses. As such, references to "means for applying a plurality of charging voltage pulses" may preferably be understood to refer to the drive circuit being configured to apply a plurality of charging voltage pulses. In some examples, the means for applying a plurality of charging voltage pulses is provided by the power supply. In other words, the power supply may be configured to apply a plurality of charging voltage pulses to the inductor to provide a single charge of the capacitance for a single cycle of ink ejection from this printhead. As such, references to "means for applying a plurality of charging voltage pulses" may most preferably be understood to refer to the power supply being configured to apply a plurality of charging voltage pulses.

Optionally, the plurality of charging voltage pulses are provided within a time period for a single charge of the capacitance. In other words, the plurality of charging voltage pulses are applied to the inductor to contribute to a single charge of the capacitance (in contrast to applying a plurality of voltage pulses over a plurality of charges of the capacitance). That is, the plurality of charging voltage pulses are applied within a single nozzle firing cycle. In some examples, the plurality of charging voltage pulses are provided within a time period without discharging the capacitance. In other words, each consecutive charging voltage pulse can further charge the capacitance more than the previous charging voltage pulse. Thus, the charge of the capacitance can cumulatively increase with each charging voltage pulse.

Optionally, the means for applying the plurality of charging voltage pulses is configured to adjust a total on-time of the charging voltage pulses. The total on-time may be regarded as the sum of the time period of each of the plurality of charging voltage pulses. In other words, this is the total width of the pulses in the time domain. In some embodiments, the pulses may be the same width (e.g. in the charging interval, and/or in the discharging interval). In other embodiments, different pulses may have different widths (e.g. in the charging interval, and/or in the discharging interval).

Optionally, the means for applying the plurality of charging voltage pulses is configured to adjust a time between the charging voltage pulses. That is, the time between the start of a first pulse and the start of a subsequent pulse. In some embodiments, the time between pulses is constant over a charging interval (or a discharging interval). In other embodiments, the time between pulses may change over a charging interval (or a discharging interval).

Optionally, the adjusting the total on-time of the charging voltage pulses and/or the adjusting the time between the charging voltage pulses is based on the capacitance of the printhead. This allows the shape of the pulse to the capacitance to be adjusted depending on the capacitance of the printhead.

Optionally, the printhead comprises multiple nozzle channels each having a respective capacitance such that the number of active nozzle channels determines the capacitance of the printhead, and wherein the adjusting the total on-time of the charging voltage pulses and/or the adjusting the time between the charging voltage pulses is based on the number of active nozzle channels. This allows the pulse to the capacitance to be adjusted depending on the number of nozzles currently firing (i.e. those which are to eject ink in this cycle), which affects the capacitance. The charging voltage pulses may be adjusted dynamically as the number of nozzles that are firing changes across the printed image. For example, the charging voltage used to charge the capacitor may be adjusted from pulse to pulse (i.e. with each cycle of ink ejection). For example, the number of active nozzles for a particular cycle of ink ejection can be determined, and a corresponding printhead capacitance can be calculated. Based on this, the pulse width and/or spacing can be adjusted based on the calculated capacitance. This can be done in real-time such that the pulse can be adjusted with each cycle if required.

Optionally, the drive circuit further comprises a first switching element connected in series between the first connection of the power supply and a first connection of the inductor, wherein the first connection of the inductor is connected to the first connection of the power supply. Optionally, the drive circuit further comprises a first switching element connected in series between the first connection of the power supply and a first connection of the inductor. Optionally, the first switching element may be a transistor, such as a MOSFET transistor, which is operable by applying a switching voltage pulse to open and close the switch.

In some examples, the drive circuit is configured to apply the plurality of charging voltage pulses by operating the first switching element. In other words, the drive circuit may be configured to operate the first switching element in order to provide a path for charging the capacitor. When the first switching element is closed, the power supply can be configured to charge the capacitor through the inductor. Thus, the power supply may be configured to apply the plurality of charging voltage pulses based on operating the first switching element. A plurality of switching pulses may be used to operate the first switching element (for example where the first switching element is a transistor), and therefore cause the plurality of charging voltage pulses to be provided by the power supply. The adjustment of the total on-time and/or spacing between charging voltage pulses can be controlled by operating the first switching element. For example, the drive circuit may control the first switching element to close for a defined time period, during which the power supply can apply a charging voltage pulse for that time period, in order to control the total on-time of the charging voltage pulses. The drive circuit may similarly control the first switching element to close the first switching element at a defined time period after the first switching element was previously opened in order to control the spacing between charging voltage pulses.

Optionally, the means for applying the plurality of charging voltage pulses is configured to repeatedly close and open the first switching element to cause the power supply to provide the plurality of charging voltage pulses to the inductor, and wherein when the first switching element is closed a charge path for current is provided to charge the capacitance through the inductor. By closing the first switching element, current can flow from the power supply to the inductor. By repeatedly opening and closing the first switching element, the plurality of charging voltage pulses can be applied to the inductor. In cases where the first switching element is a transistor, the opening and closing of the first switching element may be achieved by applying a plurality of switching voltage pulses. The time that the first switching element is closed (i.e. the width of the switching voltage pulses) determines the width of the plurality of charging voltage pulses to be applied to the inductor. Therefore, adjusting the width and spacing of the plurality of charging voltage pulses may comprise adjusting the time that the first switching element is closed for, and the time between repeated closing, respectively (i.e. the width of the switching voltage pulses and the time between).

Optionally, the drive circuit further comprises a first circuit element which permits current flow in only one direction, wherein the first circuit element is connected in series between the second connection of the power supply and a first connection of the inductor, wherein the first connection of the inductor is connected to the first connection of the power supply, and wherein the first circuit element is configured to permit current flow only in the direction from the second connection of the power supply to the first connection of the inductor. For example, the first circuit element which permits current flow only in one direction may be a diode.

Optionally, the first circuit element is configured to provide a charge path for current from the inductor to charge the capacitance in between the plurality of charging voltage pulses. The first circuit element thus provides a complete circuit to permit current to flow from the inductor and into the capacitance, allowing the capacitance to be charged in between the plurality of charging voltage pulses (e.g. when the first switching element is open). This allows the capacitance to continue to be charged (providing a smooth and consistent slew rate) in between the charging pulses.

Optionally, the plurality of charging voltage pulses comprises a first charging voltage pulse and a second charging voltage pulse, wherein the second charging voltage pulse is applied while current is still flowing through the inductor into the capacitance via the first circuit element following the first charging voltage pulse. In other words, the current through the inductor does not fall to zero before the next charging voltage pulse is applied.

Optionally, the drive circuit further comprises means for enabling a plurality of discharging voltage pulses to be applied to the inductor to provide a single discharge of the capacitance. For example, the means for enabling a plurality of discharging voltage pulses may be a switch. Analogously to the plurality of charging voltage pulses, the plurality of discharging voltage pulses to the inductor allow the capacitance to be discharged in a single pulse. The plurality of discharging voltage pulses can be adjusted in the same manner as described herein in relation to the charging voltage pulses. In other words, the plurality of discharging voltage pulses can be provided by the capacitor discharging through the inductor in phases. The capacitor can discharge a portion of its charge in each phase.

In this manner, a plurality of discharging voltage pulses can be provided to the inductor so that the plurality of discharging voltage pulses together provide a single discharge of the capacitance. This is to be differentiated from the conventional method of providing a single discharging voltage pulse to provide a single discharge of the capacitance (i.e. a one to one correspondence), and therefore from the situation where a plurality of pulses are used to provide a plurality of distinct discharges of the capacitance (still a one to one correspondence). In contrast, the single discharge of the capacitance is provided by the plurality of discharging voltage pulses. In other words, each of the discharging voltage pulses contributes a portion of the full discharge (i.e. less than the full discharge). Each discharging voltage pulse contributes to the same single discharge of the capacitance. The charge cumulatively decreases with each discharging voltage pulse of the plurality of discharging voltage pulses. This allows the capacitance to be discharged once using a plurality of charging voltage pulses.

In other words, the drive circuit may be configured to apply a plurality of discharging voltage pulses. As such, references to "means for applying a plurality of discharging voltage pulses" may preferably be understood to refer to the drive circuit being configured to apply a plurality of discharging voltage pulses. In some examples, the means for applying a plurality of discharging voltage pulses is provided by the capacitance. In other words, the capacitance may be configured to apply a plurality of discharging voltage pulses to the inductor to provide a single discharge of the capacitance for a single cycle of ink ejection from this printhead. As such, references to "means for applying a plurality of discharging voltage pulses" may preferably be understood to refer to the capacitance being configured to apply a plurality of discharging voltage pulses.

In some cases, the plurality of discharging voltage pulses being applied preferably refers to the capacitor discharging in a plurality of discrete pulses. In other words, the discharge of the capacitor may occur in discrete steps where a portion of the charge is discharged with each step. Accordingly, a discharging voltage pulse may preferably be interpreted as a voltage pulse travelling from the capacitor, through the inductor, and to the ground rail in order to discharge the capacitor.

Optionally, the plurality of discharging voltage pulses are provided within a time period for a single discharge of the capacitance. In other words, the plurality of discharging voltage pulses are applied to the inductor to contribute to a single discharge of the capacitance (in contrast to applying a plurality of voltage pulses over a plurality of discharges of the capacitance). That is, the plurality of discharging voltage pulses are applied within a single nozzle firing cycle. In some examples, the plurality of discharging voltage pulses are provided within a time period without charging the capacitance. In other words, each consecutive discharging voltage pulse can further discharge the capacitance more than the previous discharging voltage pulse. Thus, the charge of the capacitance can cumulatively decrease with each discharging voltage pulse.

Optionally, the means for enabling the plurality of discharging voltage pulses is configured to adjust a total on-time of the discharging voltage pulses.

Optionally, the means for enabling the plurality of discharging voltage pulses is configured to adjust a time between the discharging voltage pulses.

Optionally, the adjusting the total on-time of the discharging voltage pulses and/or the adjusting the time between the discharging voltage pulses is based on the capacitance of the printhead.

Optionally, the printhead comprises multiple nozzle channels each having a respective capacitance, such that the number of active nozzle channels determines the capacitance of the printhead, and wherein the adjusting the total on-time of the discharging voltage pulses and/or the adjusting the time between the discharging voltage pulses is based on the number of active nozzle channels. Active nozzle channels are nozzle channels which are currently printing in that cycle of ink ejection.

Optionally, the drive circuit further comprises a second switching element connected in series between the second connection of the power supply and a first connection of the inductor, wherein the first connection of the inductor is connected to the first connection of the power supply.

Optionally, the drive circuit further comprises a second switching element connected in series between the second connection of the power supply and a first connection of the inductor. Optionally, the second switching element may be a transistor, such as a MOSFET transistor, which is operable by applying a switching voltage pulse to open and close the switch.

In some examples, the drive circuit is configured to apply the plurality of discharging voltage pulses by operating the second switching element. In other words, the drive circuit may be configured to operate the second switching element in order to provide a path for discharging the capacitor. When the second switching element is closed, the capacitor can discharge through the inductor. Thus, the capacitance may be configured to apply the plurality of discharging voltage pulses based on operating the second switching element. A plurality of switching pulses may be used to operate the second switching element (for example where the second switching element is a transistor), and therefore cause the plurality of discharging voltage pulses to be provided by the capacitance. The adjustment of the total on-time and/or spacing between discharging voltage pulses can be controlled by operating the second switching element. For example, the drive circuit may control the second switching element to close for a defined time period, during which the capacitance can apply a discharging voltage pulse for that time period, in order to control the total on-time of the discharging voltage pulses. The drive circuit may similarly control the second switching element to close the second switching element at a defined time period after the second switching element was previously opened in order to control the spacing between discharging voltage pulses.

Optionally, the means for enabling the plurality of discharging voltage pulses is configured to repeatedly close and open the second switching element to cause the capacitance to provide the plurality of discharging voltage pulses to the inductor, and wherein when the second switching element is closed a discharge path for current is provided to discharge the capacitance through the inductor. By closing the second switching element, current can flow from the capacitance to the inductor. By repeatedly opening and closing the second switching element, the plurality of discharging voltage pulses can be applied from the capacitance to the inductor.

In cases where the second switching element is a transistor, the opening and closing of the second switching element may be achieved by applying a plurality of switching voltage pulses. The time that the second switching element is closed (i.e. the width of the switching voltage pulses) determines the width of the plurality of discharging voltage pulses to be applied to the inductor. Therefore, adjusting the width and spacing of the plurality of discharging voltage pulses may comprise adjusting the time that the second switching element is closed for, and the time between repeated closing, respectively (i.e. the width of the switching voltage pulses and the time between).

Optionally, the drive circuit further comprises a second circuit element which permits current flow in only one direction, wherein the second circuit element is connected in series between a first connection of the inductor and the first connection of the power supply, wherein the first connection of the inductor is connected to the first connection of the power supply, and wherein the second circuit element is configured to permit current flow only in the direction from the first connection of the inductor to the first connection of the power supply. For example, the second circuit element which permits current flow only in one direction may be a diode.

Optionally, the second circuit element is configured to provide a discharge path for current from the inductor into the power supply in between the plurality of discharging voltage pulses. The second circuit element thus provides a complete circuit to permit current to flow from the inductor and into the power supply, allowing the capacitance to be discharged in between the plurality of discharging voltage pulses (e.g. when the second switching element is open). This allows the capacitance to continue to be discharged (providing a smooth and consistent slew rate) in between the charging pulses. This also allows energy to be recovered back into the power supply.

Optionally, the drive circuit further comprises a ballast capacitor connected between a second connection of the inductor and the second connection of the power supply, wherein the second connection of the inductor is connected to the first drive connection the printhead. In other words, the ballast capacitor is connected in parallel with the capacitance of the printhead. As such, as the capacitance of the printhead is charged and discharged, so will the ballast capacitor. The ballast capacitor is provided to reduce the effect of percentage variation of the capacitance when the number of active nozzles varies, and thus helps provide control over slew rates over a large range of capacitances.

Optionally, the drive circuit further comprises a third circuit element which permits current flow in only one direction, wherein the third circuit element is connected in series between the second connection of the power supply and a second connection of the inductor, wherein the second connection of the inductor is connected to the first drive connection the printhead, and wherein the third circuit element is configured to permit current flow only in the direction from the second connection of the power supply to the second connection of the inductor. For example, the third circuit element which permits current flow only in one direction may be a diode. The third circuit element is provided to prevent the output voltage (across the capacitance of the printhead and the ballast capacitor) going below the ground voltage, defined by the second connection of the power supply, thereby protecting the printhead.

Optionally, the drive circuit further comprises a fourth circuit element which permits current flow in only one direction, wherein the fourth circuit element is connected in series between a second connection of the inductor and the first connection of the power supply, wherein the second connection of the inductor is connected to the first drive connection the printhead, and wherein the fourth circuit element is configured to permit current flow only in the direction from the second connection of the inductor to the first connection of the power supply. For example, the fourth circuit element which permits current flow only in one direction may be a diode. The fourth circuit element is provided to prevent the output voltage (across the capacitance of the printhead and the ballast capacitor) going above the supply voltage, defined by the first connection of the power supply, thereby protecting the printhead.

Optionally, the drive circuit further comprises a resistor connected between a second connection of the inductor and the second connection of the power supply, wherein the second connection of the inductor is connected to the first drive connection the printhead. The resistor is provided as a bleed resistor to ensure that the capacitance of the printhead (and the ballast capacitor) do not drift away from the supply voltage defined by the first connection of the printhead.

According to a second aspect of the present disclosure, there is provided a method of operating a drive circuit for charging a printhead for ejecting drops of ink, the printhead having a capacitance, wherein the drive circuit comprises an inductor connected to a drive connection of the printhead to provide a charge path for current to charge the capacitance, the method comprising: applying a plurality of charging voltage pulses to the inductor to provide a single charge of the capacitance for a single cycle of ink ejection from the printhead.

Optionally, the method further comprises providing one or more features of the drive circuit disclosed herein. Each feature described in relation to the drive circuit can be applied as a method feature. For example, the method may further comprise enabling a plurality of discharging voltage pulses to be applied to the inductor to provide a single discharge of the capacitance.

Aspects of the present disclosure may be provided in conjunction with each other. Features described in relation to one aspect may be applied to other aspects alone or in combination, and vice versa. In particular, features of the drive circuit described in relation to the first aspect can be applied to the method of the second aspect, and vice versa. In particular, the method of the second aspect may further include any of the features of the drive circuit described in relation to the first aspect.

BRIEF DESCRIPTION OF THE DRAWINGS

Embodiments of the present disclosure will now be described, by way of example only, with reference to the following Figures.

DETAILED DESCRIPTION

Figure 1:
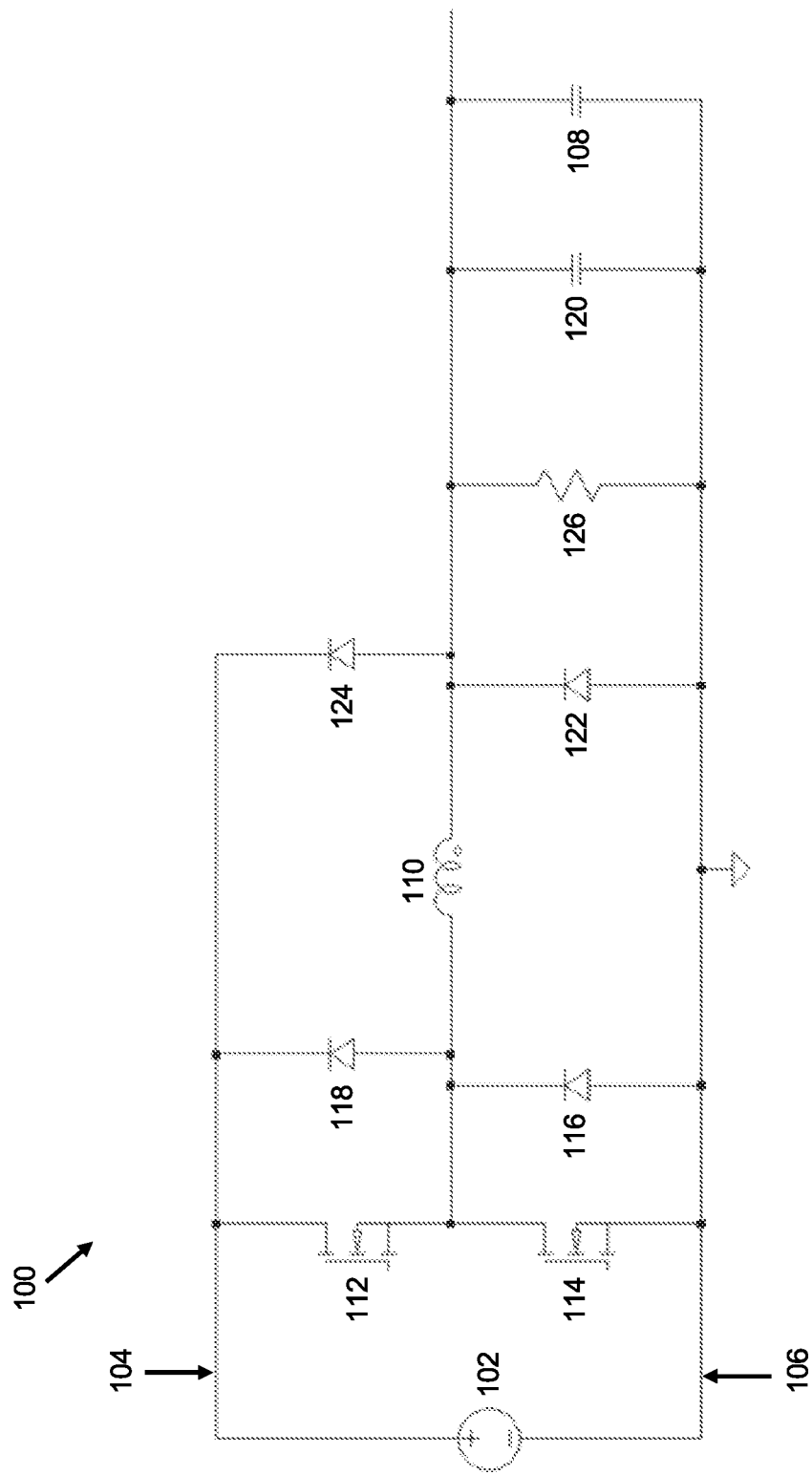
FIG. 1 shows a schematic diagram of a drive circuit according to a first embodiment of the present disclosure.

Referring to FIG. 1, a drive circuit 100 according to a first embodiment of the present disclosure is provided. The drive circuit 100 is for driving a printhead to eject drops of ink. A printhead typically comprises multiple nozzle channels, where a certain number (active nozzles) are fired for each cycle of the printing operation, depending on what needs to be printed. The nozzles have a respective capacitance, and the nozzles are charged and discharged to fire the nozzles. The charge required depends on the number of nozzles, as the printhead capacitance will vary accordingly. The time to charge and discharge the capacitance defines the slew rate. It is preferable to have control over the slew rate to determine the pulse shape for desired printing quality and efficiency.

The drive circuit 100 comprises a power supply 102. In the first embodiment, the power supply 102 is a DC power supply configured to supply a constant DC voltage, in particular 48 V. The power supply 102 has a positive terminal which defines a supply rail 104, and a negative terminal which defines the ground rail 106.

The drive circuit 100 also comprises a capacitor 108. In an inkjet printer, the printhead can be controlled to eject droplets of ink from an array of nozzles by applying a voltage to the nozzles. The printhead has a capacitance which will depend on the number of nozzles of the printhead currently firing (e.g. depending on the printing requirements), where the larger the number of nozzles, the larger the printhead capacitance. The capacitor 108 represents the capacitance of the printhead. Thus, the drive circuit 100 is provided for driving a printhead capacitance in an inkjet printer. In the first embodiment, the capacitor 108 represents the total capacitance of the printhead when all the nozzles are active. In other words, this is the maximum capacitance, which will be lower when fewer nozzles are firing. In the first embodiment, the maximum capacitance of the printhead is 300 nF, which is represented by the capacitor 108 having a capacitance of 300 nF.

As will be described in more detail below, in some embodiments the drive circuit 100 comprises a ballast capacitor 120 in parallel with the capacitor 108 of the printhead. Thus, the total capacitance will be the sum of the capacitances of the printhead capacitor 108 and the ballast capacitor 120. As such, references herein to applying a voltage to the capacitor 108, and charging or and discharging the capacitor 108, should be understood to also apply to the ballast capacitor 120, which will experience the same voltage and will be charged and discharged along with the printhead capacitor 108.

At the most general level, the power supply 102 is connected across the capacitor 108 to apply a voltage to charge the capacitor 108, causing droplets of ink to be released from the active nozzles of the printhead.

The drive circuit 100 also comprises an inductor 110. The inductor 110 is arranged in series with the capacitor 108. In particular, the inductor 110 is arranged between the supply rail 104 (i.e. the positive terminal of the power supply 102) and the capacitor 108. The capacitor 108 is in turn connected to the ground rail 106 (i.e. the negative terminal of the power supply 102).

In the first embodiment, the inductor 110 has an inductance of 1.2 µH. The value of the inductance can be chosen to give a desired slew rate for the highest capacitance that the drive circuit 100 will need to operate with.

The drive circuit 100 further comprises a first switch 112. In the first embodiment, the first switch 112 is a MOSFET transistor (metal oxide semiconductor field-effect transistor), in particular comprising a gallium nitride (GaN) semiconductor. The first switch 112 is connected between the supply rail 104 and the inductor 110. In particular, the first switch 112 is connected between the supply rail 104 and a first connection of the inductor 110 (shown on the left-hand side of the inductor 110 in FIG. 1). The inductor 110 is connected via its second connection (shown on the right-hand side of the inductor 110 in FIG. 1) to the capacitor 108.

When the first switch 112 is closed, a voltage is applied across the inductor 110 and the capacitor 108 between the supply rail 104 and the ground rail 106. A path for current is provided which enables current to flow out of the power supply 102 from the supply rail 104, through the first switch 112, through the inductor 110, and subsequently into the capacitor 108. This current flow enables the power supply 102 to store energy in the inductor 110 as a magnetic field, and can consequently charge the capacitor 108. This also enables the ballast capacitor 120 to be charged.

The drive circuit 100 further comprises a second switch 114. In the first embodiment, the second switch 114 is a MOSFET transistor, in particular comprising a GaN semiconductor. The second switch 114 is connected between the inductor 110 and the ground rail 106. In particular, the second switch 114 is connected between the first connection of the inductor 110 and the ground rail 106.

As will be described in more detail below, the second switch 114 is used to discharge the capacitor 108. In particular, the second switch 114 may be closed when the capacitor 108 is charged to a desired extent (and the first switch 112 is open). When the second switch 114 is closed, a path for current is provided which enables current to flow out of the charged capacitor 108 (and the ballast capacitor 120), through the inductor 110, and through the second switch 114 to the ground rail 106. The direction of flow of current is therefore opposite to the current when charging. This enables the capacitor 108 to be partially discharged.

The drive circuit 100 also comprises a first diode 116. The first diode 116 is connected between the ground rail 106 and the inductor 110. In particular, the first diode 116 is connected between the ground rail 106 and the first connection of the inductor 110. The first diode 116 is thus arranged in parallel with the second switch 114. The first diode 116 is connected to permit current flow only in the direction from the ground rail 106 to the first connection of the inductor 110, and hence prevents current flow in the direction from the first connection of the inductor 110 to the ground rail 106. In other words, the first diode 116 is reverse biased relative to the polarity of the power supply 102.

When the first switch 112 is closed, current will not flow through the first switch 112 and through the first diode 116 to the ground rail 106 because of the reverse bias of the first diode 116. Instead, when the first switch 112 is closed, current begins to flow through the inductor 110. As current flows, more energy is stored in the magnetic field of the inductor 110, and the capacitor 108 starts to become charged.

Once the first switch 112 has been closed for a desired amount of time (i.e. a desired amount of energy is stored in the magnetic field of the inductor 110), the first switch 112 can be opened. Due to the sudden drop in current through the first switch 112, a voltage is induced across the inductor 110 having an opposite polarity. In other words, in contrast to the situation above when the power supply 102 is charging the inductor 110 (where the first connection of the inductor 110 has a positive polarity and the second connection of the inductor 110 has a negative polarity), when the first switch 112 is opened the second connection of the inductor 110 is instead positive and the first connection of the inductor 110 is negative.

A current path is provided from the second connection of the inductor 110 (which is positive) through the capacitor 108 to the ground rail 106, while the first diode 116 provides the path back to the first connection of the inductor 110 (which is negative). This loop, provided by the first diode 116, allows current to continue to flow from the inductor 110 into the capacitor 108, even after the first switch 112 is opened. In other words, the inductor 110 can act as a power supply to charge the capacitor 108. The energy stored in the magnetic field of the inductor 110 can be transferred into electrostatic energy in the capacitor 108. In this manner, the capacitor 108 can continue to be charged even when the power supply 102 is not connected.

The drive circuit 100 also comprises a second diode 118. The second diode 118 is connected between the inductor 110 and the supply rail 104. In particular, the second diode 118 is connected between the first connection of the inductor 110 and the supply rail 104. The second diode 118 is thus arranged in parallel with the first switch 112. The second diode 118 is connected to permit current flow only in the direction from the first connection of the inductor 110 to the supply rail 104, and hence prevents current flow in the direction from the supply rail 104 to the first connection of the inductor 110. In other words, the second diode 118 is reverse biased relative to the polarity of the power supply 102. When the first switch 112 is closed, current will not flow from the supply rail 104 through the second diode 118 because of the reverse bias of the second diode 118.

To discharge the capacitor 108, the second switch 114 can be closed (and assuming the first switch 112 has already been opened). Current can begin to flow out of the capacitor 108 and into the inductor 110, where energy can be stored in the magnetic field. Once the second switch 114 has been closed for a desired amount of time (i.e. a desired amount of energy is stored in the magnetic field of the inductor 110), the second switch 114 can be opened. As with the opening of the first switch 112, due to the sudden drop in current through the second switch 114, a voltage is induced across the inductor 110 having an opposite polarity.

When the second switch 114 is opened, the second diode 118 provides a current path which enables current to continue to flow through the inductor 110 from the capacitor 108 to the supply rail 104. As current is already flowing through the inductor 110 at the time that the second switch 114 is opened, and as the current can no longer flow through the opened second switch 114, it flows through the second diode 118 as the only available path. In other words, the current flow allows the capacitor 108 to continue to discharge even when the second switch 114 is opened. Some of the energy required to charge the capacitor 108 can therefore be recovered and supplied back into the power supply 102. In particular, the energy stored in the magnetic field of the inductor 110 can be transferred into energy stored in the power supply 102. This can reduce the total energy wastage and reduce the need for cooling equipment such as large heatsinks.

In the first embodiment, the drive circuit 100 also comprises a ballast capacitor 120. Although, in other embodiments, the ballast capacitor 120 is not present. The ballast capacitor 120 is connected between the ground rail 106 and the inductor 110. In particular, the ballast capacitor 120 is connected between the ground rail 106 and the second connection of the inductor 110. The ballast capacitor 120 is thus arranged in parallel with the capacitor 108 (i.e. the printhead capacitor).

When a ballast capacitor 120 is provided, the total capacitance is defined by the sum of the capacitances of the printhead capacitor 108 and the ballast capacitor 120. When the drive circuit 100 applies a voltage to the capacitor 108, the voltage is also applied to the ballast capacitor 120. The ballast capacitor 120 is also charged and discharged along with the printhead capacitor 108 in the manner described above.

The ballast capacitor 120 is provided to allow greater control of the slew rate over a range of capacitance, for example due to the varying capacitance of the printhead capacitor 108. As the printhead capacitance of capacitor 108 varies depending on the number of active nozzles, the drive circuit 100 must cope with a wide range of capacitances. By providing a ballast capacitor 120, the range of capacitances that the drive circuit 100 has to cope with can be reduced. This is because the total capacitance (the sum of the capacitances of the capacitor 108 and the ballast capacitor 120) is higher, and thus the variation between the minimum and the maximum capacitance due to the varying printhead capacitance is reduced. In the first embodiment, the ballast capacitor 120 has a capacitance of 200 nF. Along with the printhead capacitance of the capacitor 108 of 300 nF, this provides a total maximum capacitance of 500 nF. Choosing a value for the ballast capacitor 120 is a compromise where a larger value gives a better pulse shape but more current is required and hence more losses result, whereas a smaller value gives more variability in pulse shape, but leads to lower losses.

The drive circuit 100 also comprises a third diode 122. In some embodiments, the third diode 122 may not be provided. The third diode 122 is connected between the ground rail 106 and the inductor 110. In particular, the third diode 122 is connected between the ground rail 106 and the second connection of the inductor 110. The third diode 122 is thus arranged in parallel with the capacitor 108 and the ballast capacitor 120. The third diode 122 is connected to permit current flow only in the direction from the ground rail 106 to the second connection of the inductor 110, and hence prevents current flow in the direction from the second connection of the inductor 110 to the ground rail 106. In other words, the third diode 122 is reverse biased relative to the polarity of the power supply 102. The third diode 122 is provided to prevent the output going below the ground voltage defined by the ground rail 106 (e.g. 0 V). As such, this may protect the printhead.

The drive circuit 100 also comprises a fourth diode 124. In some embodiments, the fourth diode 124 may not be provided. The fourth diode 124 is connected between the inductor 110 and the supply rail 104. In particular, the fourth diode 124 is connected between the second connection of the inductor 110 and the supply rail 104. The fourth diode 124 is connected to permit current flow only in the direction from the second connection of the inductor 110 to the supply rail 104, and hence prevents current flow in the direction from the supply rail 104 to the second connection of the inductor 110. In other words, the fourth diode 124 is reverse biased relative to the polarity of the power supply 102. The fourth diode 124 is provided to prevent the output going above the supply voltage defined by the supply rail 104 (e.g. 48 V). As such, this may protect the printhead.

The drive circuit 100 also comprises a resistor 126. The resistor 126 is a bleed resistor to ensure that the capacitor 108 (and the ballast capacitor 120) do not drift away from the supply voltage of the supply rail 106. The resistor 126 is connected between the second connection of the inductor 110 and the ground rail 106. The resistor 126 is thus arranged in parallel with the capacitor 108, the ballast capacitor 120, and the third diode 122. In the first embodiment, the resistor 126 has a resistance of 20 kΩ.

Figure 2:
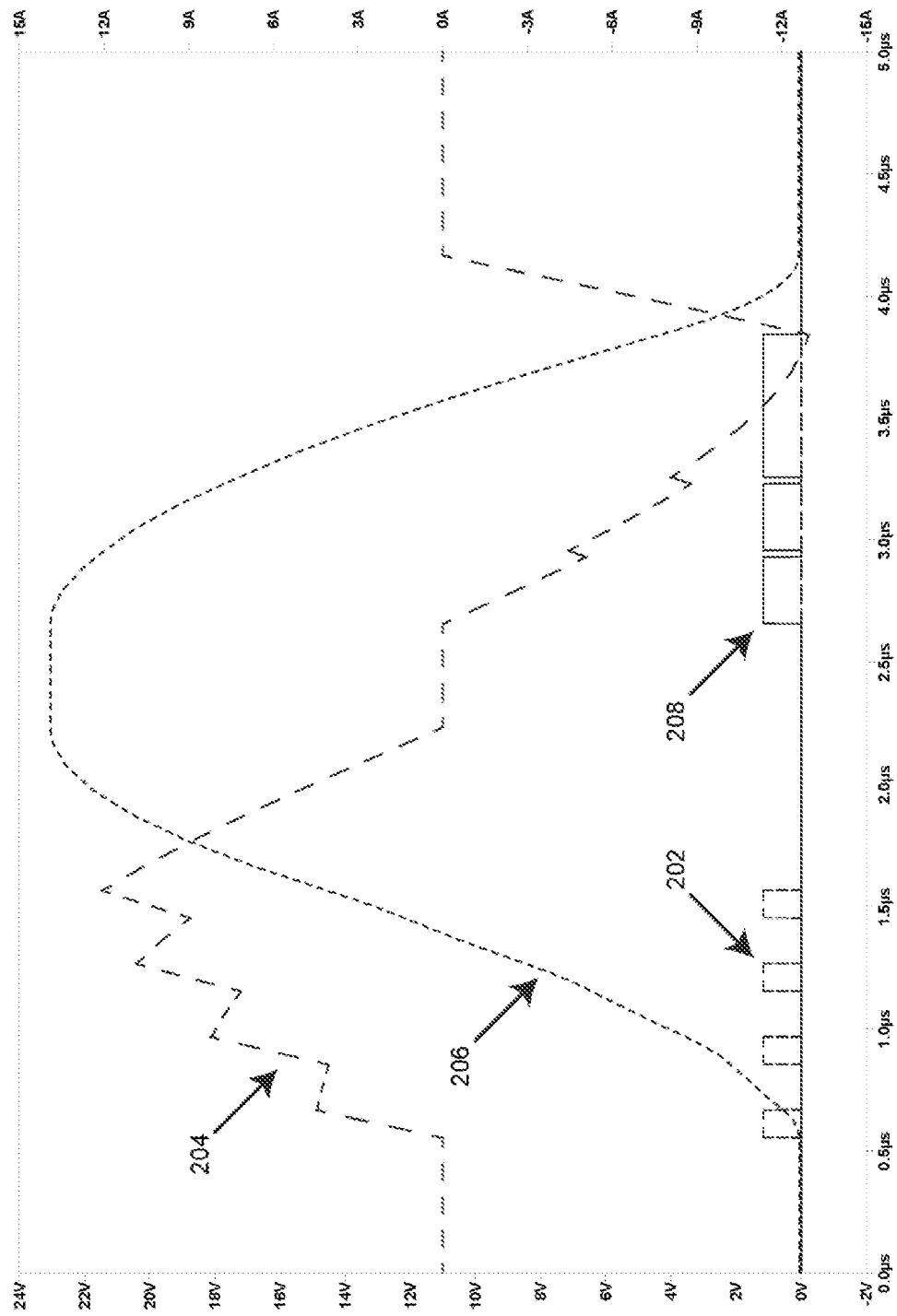
FIG. 2 shows traces of the switching pulse, the inductor current, and the output voltage when the drive circuit of the first embodiment is operated.

Referring to FIG. 2, the process of closing and opening the first switch 112 in order to charge the capacitor 108 and the ballast capacitor 120 together will now be described in more detail. In this embodiment, the printhead capacitor 108 has a maximum capacitance of 300 nF, providing a total capacitance of 500 nF, account for the ballast capacitor 120 having a 200 nF capacitance.

FIG. 2 shows a trace 202 showing a plurality of voltage pulses applied to the first switch 112 in the drive circuit 100 shown in FIG. 1. As the first switch 112 is a transistor in the first embodiment, applying a voltage allows the switch to move from a substantially open state to a substantially closed state (i.e. allows current to flow). The plurality of voltage pulses applied to the first switch 112 may be referred to as the switching voltage pulses (in particular the charging switching voltage pulses). FIG. 2 shows four voltage pulses in the trace 202, although other numbers of pulses can be used in other embodiments. Considering the first voltage pulse (the first pulse in time on the left-hand side of the trace 202), the voltage pulse is substantially a rectangular wave having a maximum voltage of approximately 1 V. The first pulse begins at time T1, at around 0.55 μs, and lasts a duration of approximately 0.11 μs. When the voltage pulse 202 goes high (i.e. rises from zero to the maximum), this causes the transistor to permit current flow, thereby closing the first switch 112. The first switch 112 then remains closed for around 0.11 μs, and then as the voltage pulse 202 goes low, the first switch 112 is opened. The first pulse returns to 0 V at time T2, at around 0.67 μs. As the first switch 112 being closed allows the power supply 102 to charge the capacitor 108 and the ballast capacitor 120 through the inductor 110, repeatedly closing and opening the first switch 112 effectively causes the power supply 102 to provide a plurality of charging voltage pulses to the inductor 110 for charging the capacitor 108 and the ballast capacitor 120. In other words, a plurality of voltage pulses are applied to the inductor 110. These voltage pulses to the inductor 110 are shown in the trace 310 in FIG. 3, where, because the first switch 112 is closed, the power supply 102 applies a voltage equal to the supply (48 V) to the inductor 110.

Referring back to FIG. 2, the trace 204 shows the current through the inductor 110. When the first switch 112 is initially open (e.g. from time T0 at 0 μs to time T1 at around 0.55 μs), the current through the inductor 110 is 0 A.

The trace 206 shows the output voltage. This is the voltage across the capacitor 108 and the ballast capacitor 120. When the first switch 112 is initially open (e.g. from time T0 at 0 μs to time T1 at around 0.55 μs), the voltage across the capacitor 108 and the ballast capacitor 120 is 0 V.

While the first switch 112 is closed, the current as shown in the trace 204 begins to increase over time. In other words, current begins to flow through the inductor 110, and the inductor 110 begins to store energy in a magnetic field. At time T2, the first switch 112 is opened and the trace 204 shows that the current stops increasing. At time T2, the current reaches about 4.4 A.

While the first switch 112 is closed, the output voltage across the capacitor 108 and the ballast capacitor 120 also begins to increase. As the current through the inductor 110 increases, the voltage across the capacitor 108 and the ballast capacitor 120 also increases. The voltage can be seen to begin to increase in the trace 206 when the first switch 112 is closed at time T1.

While the first switch 112 is opened, the current as shown in the trace 204 begins to decrease as the energy stored in the inductor 110 dissipates into the capacitor 108 and the ballast capacitor 120, where the circuit is completed by the first diode 116. If the first switch 112 were left opened, the inductor 110 would then continue to decrease until the current through the inductor 110 drops to 0 A.

While the first switch 112 is opened, the output voltage across the capacitor 108 and the ballast capacitor 120 continues to increase. This is because the energy in the inductor 110 is transferred to the capacitor 108 and the ballast capacitor 120 via the current flow through the first diode 116. The capacitor 108 and the ballast capacitor 120 thus continue to be charged after the first switch 112 is opened and the power supply 102 is disconnected. If the first switch 112 were left opened, the output voltage across the capacitor 108 and the ballast capacitor 120 would continue to increase until the current through the inductor 110 drops to 0 A.

After a period of time (around 0.19 μs), the first switch 112 is closed again at time T3, at about 0.85 μs. This can be seen by the second voltage pulse in the trace 202. As with the first pulse, the second voltage pulse has a duration of about 0.11 μs. At this point, the current through the inductor 110 stops decreasing as shown in the trace 204. In FIG. 2, the current decreases to about 4 A at time T3. In other words, before the current through the inductor 110 drops to 0 A, the first switch 112 is closed again in order to further inject current into the inductor 110 from the power supply 102.

When the first switch 112 is closed again, the process described above repeats: the current through the inductor 110 increases, and in turn the output voltage across the capacitor 108 and the ballast capacitor 120 increases. This injection of energy from the power supply 102 allows more energy to be stored in the inductor 110 and hence to be transferred into the capacitor 108 and the ballast capacitor 120.

When the first switch 112 is opened again at the end of the second pulse at time T4, at around 0.97 μs, the current through the inductor 110 decreases and the voltage across the capacitor 108 and the ballast capacitor 120 continues to rise.

With each pulse in the trace 202, the capacitor 108 and the ballast capacitor 120 become increasingly more charged towards the desired pulse voltage. The first switch 112 is closed again at time T5, and opened at time T6 to provide the third pulse in the trace 202. The first switch is then closed again at time T7, and opened at time T8 to provide the fourth pulse in the trace 202. Eventually, following the fourth pulse going low at T8, at around 1.6 μs, the inductor 110 continues to charge the capacitor 108 and the ballast capacitor 120, until the current through the inductor 110 in the trace 204 drops to 0 A at time T9 (at around 2.24 μs). At this point, the voltage of the trace 206 stops increasing, and reaches a peak at the desired voltage, which in the first embodiment is at around 23 V. If a lower peak voltage is desired, shorter pulses or fewer pulses may be used.

Figure 3:
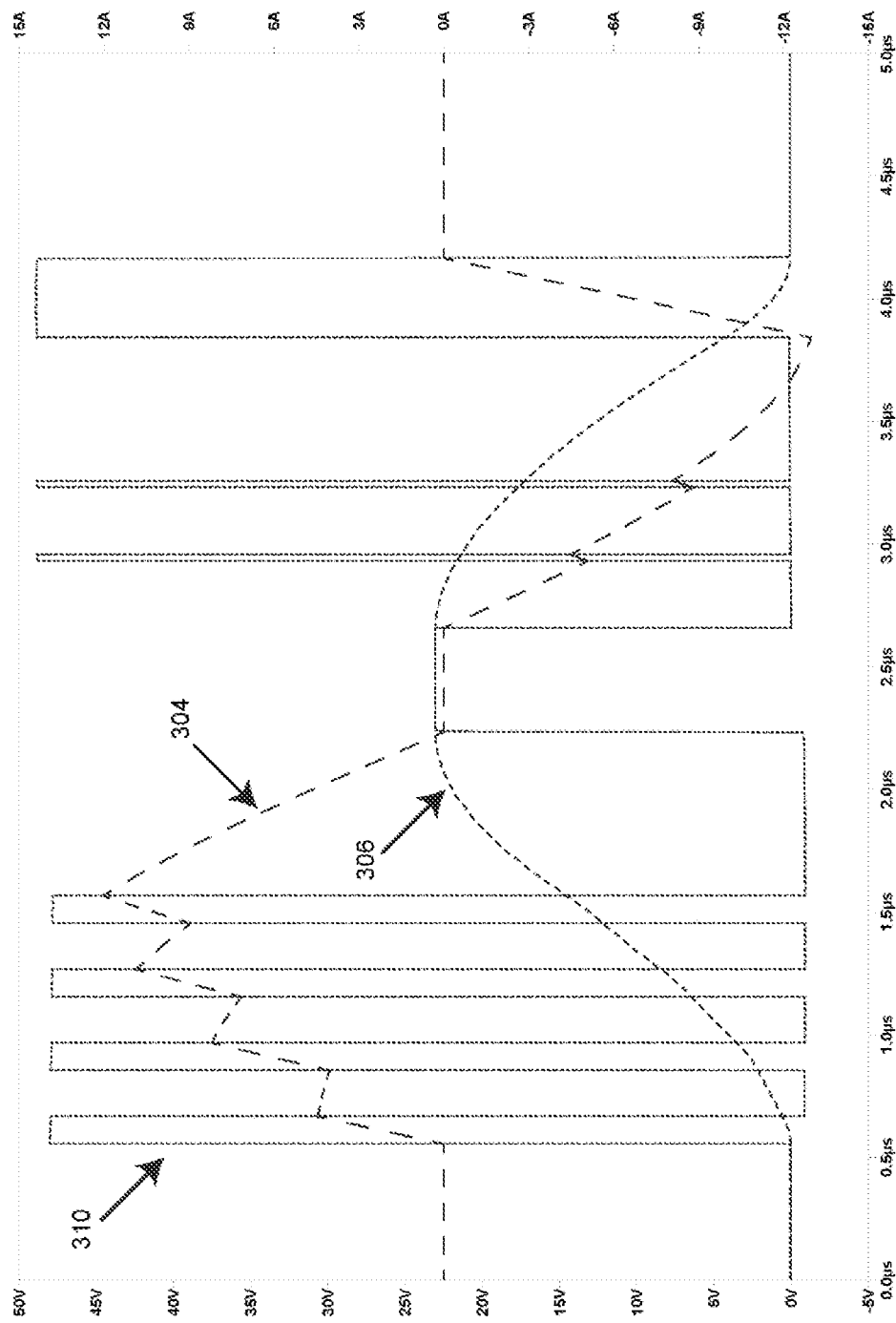
FIG. 3 shows traces of the charging voltage pulses, the inductor current, and the output voltage when the drive circuit of the first embodiment is operated.

In this manner, a plurality of switching voltage pulses (i.e. the trace 202) are used to repeatedly turn the first switch 112 on and off over a single charging time period for the capacitor 108 and the ballast capacitor 120. In other words, the closing and opening of the first switch 112 causes the power supply 102 to provide a plurality of charging voltage pulses to the inductor 110, which then charges the capacitor 108 and the ballast capacitor 120. Referring to FIG. 3, the trace 310 shows the plurality of voltage pulses applied to the inductor 110 as a consequence of the switching voltage pulses in the trace 202. It can be seen that each of the four switching voltage pulses generates a voltage pulse of the supply voltage (48 V) to the inductor 110 for that time period. FIG. 3 also shows that the time that the voltage pulses in the trace 310 are applied corresponds to the rise in current through the inductor 110, as shown by the trace 304, which is identical to the trace 204 shown in FIG. 2. The trace 306 also shows the output voltage across the capacitor 108 and the ballast capacitor 120, which is identical to the trace 206 shown in FIG. 2.

As such, a plurality of pulses to the inductor 110 are distributed over the charge interval. This is in contrast to providing a single pulse directly to the capacitor 108 to achieve the full charge. The operation of the drive circuit 100 allows the charging of the capacitor 108 to be distributed in a plurality of discrete pulses to the inductor 110. By spacing the injection of current over time, the slew rate (the rise time of the charging of the capacitor 108 and the ballast capacitor 120) can be controlled.

As energy is stored in the inductor 110, the inductor 110 can continue to charge the capacitor 108 and the ballast capacitor 120 whilst the power supply 102 is not connected. In other words, the capacitor 108 and the ballast capacitor 120 can continue to be charged in between the plurality of charging voltage pulses applied by the power supply 102 when the first switch 112 is closed. This allows the voltage of the capacitor 108 and the ballast capacitor 120 to rise consistently even when a charging pulse is not applied by the power supply 102, providing for a consistent slew rate.

By providing a plurality of pulses in this way, the slew rate can be controlled. In particular, the spacing between the pulses determines how quickly more energy is injected into the drive circuit 100, and how quickly the voltage across the capacitor 108 and the ballast capacitor 120 rises. Therefore, the spacing between the pulses can be controlled to provide the desired slew rate. FIGS. 2 and 3 show how a smooth and consistent slew rate can be achieved in the charging voltage of the trace 206.

The ratio of the total on-time of the first switch 112 (in other words, the combined width of the switching pulses to the first switch 112 in the trace 202) to the capacitance of the capacitor 108 and the ballast capacitor 120 determines the charging voltage achieved. Therefore, the width of the pulses can be adjusted to provide the desired charging voltage for a given capacitance. For example, when the capacitance reduces because fewer nozzles are active, the width of the pulses can be reduced to provide a consistent charging voltage in spite of the change in capacitance. The widths can be adjusted in real-time by feeding back the number of active nozzles to calculate the required pulse widths for each charging cycle of the printhead.

The discharging of the capacitor 108 and the ballast capacitor 120 can be controlled in an analogous way. Referring to FIG. 2, the process of closing and opening the second switch 114 in order to discharge the capacitor 108 and the ballast capacitor 120 will now be described in more detail.

FIG. 2 shows a trace 208 showing a plurality of voltage pulses applied to the second switch 114 in the drive circuit 100 shown in FIG. 1. The voltage pulses work in the same way as for the first switch 112, where applying a voltage allows the second switch 114 to move from a substantially open state to a substantially closed state (i.e. allows current to flow). The plurality of voltage pulses applied to the second switch 114 may be referred to as the switching voltage pulses (in particular, discharging switching voltage pulses). FIG. 2 shows three voltage pulses in the trace 208, although other numbers of pulses can be used in other embodiments. Considering the first voltage pulse (the first pulse in time on the left-hand side of the trace 208), the voltage pulse is substantially a rectangular wave having a maximum voltage of approximately 1 V. The first pulse begins at time T10 (at around 2.66 µs), and lasts a duration of approximately 0.27 µs. In the first embodiment, the pulse length for the discharging switching pulses in the trace 208 is significantly longer than for the charging switching pulses in the trace 202. This is because the discharging uses a voltage of around 23 V (defined by the voltage across the capacitor 108 and the ballast capacitor 120), whereas the charging uses the full supply voltage of 48 V. Therefore, longer pulses are required to provide the desired slew rate.

When the switch voltage pulse goes high (i.e. rises from zero to the maximum), this causes the transistor to permit current flow, thereby closing the second switch 114. The second switch 114 then remains closed for around 0.27 µs, and then as the voltage pulse 208 goes low, the second switch 114 is opened.

The trace 204 shows that the current through the inductor 110 is 0 A at time T10 as the capacitor 108 and the ballast capacitor 120 are charged to the required pulse voltage and the second switch 114 is initially open.

The trace 206 shows that the voltage across the capacitor 108 is 23 V at time T10 when capacitor 108 and the ballast capacitor 120 are charged to the required pulse voltage and the second switch 114 is initially open.

While the second switch 114 is closed, the current as shown in the trace 204 begins to increase in magnitude over time (but the current is recorded as negative as the current flow is in the opposite direction to charging). At time T11 (at around 2.93 µs), the second switch 114 is opened and the trace 204 shows that the current stops increasing in magnitude. At time T11, the current reaches about −5 A.

When the second switch 114 is closed, the voltage across the capacitor 108 and the ballast capacitor 120 begins to decrease. In other words, closing the second switch 114 allows the capacitor 108 and the ballast capacitor 120 to discharge, and the voltage begins to drop as current begins to flow. The capacitor 108 and the ballast capacitor 120 are thus discharging through the inductor 110 to the ground rail 106. As the current through the inductor 110 increases (becomes more negative), the voltage across the capacitor 108 and the ballast capacitor 120 decreases. The voltage can be seen to begin to decrease in the trace 206 when the second switch 114 is closed at time T10.

After a period of time (around 0.27 µs), the second switch 114 is opened at time T11, at which point the current through the inductor 110 stops increasing. While the second switch 114 is opened, the current as shown in the trace 204 begins to decrease in magnitude towards 0 A as the energy stored in the inductor 110 transfers into the power supply 102, where the circuit is completed by the second diode 118.

While the second switch 114 is opened, the voltage across the capacitor 108 and the ballast capacitor 120 continues to decrease. This is because the energy in the capacitor 108 and the ballast capacitor 120 discharges into the power supply 102 via the inductor 110 and the second diode 118 as described above. The capacitor 108 and the ballast capacitor 120 thus continue to be discharged after the second switch 114 is opened. This process of returning energy to the power supply 102 can allow some of the energy used to charge the capacitor 108 and the ballast capacitor 120 to be recovered.

After a period of time (around 0.027 μs), the second switch 114 is closed again at time T12, at around 2.958 μs. This can be seen by the second voltage pulse in the trace 208. At this point, the current through the inductor 110 stops decreasing. In FIG. 2, the current decreases to about −4.45 A before the second switch 114 is closed again.

When the second switch 114 is closed again, the process described above repeats: the current through the inductor 110 increases, and in turn the voltage across the capacitor 108 and the ballast capacitor 120 continues to decrease.

When the second switch 114 is opened again at the end of the second pulse at time T13, the current through the inductor 110 decreases and the voltage across the capacitor 108 and the ballast capacitor 120 continues to decrease as the inductor 110 returns energy to the power supply 102.

With each pulse in the trace 208, the capacitor 108 and the ballast capacitor 120 become more discharged. The second switch 114 is then closed at time T14, and opened at time T15, thereby forming the third pulse in the trace 208. In the first embodiment, the third switching pulse in the trace 208 is wider than the earlier pulses. This is because as the capacitor 108 and the ballast capacitor 120 discharge, the voltage of the capacitor 108 and the ballast capacitor 120 decreases with time, meaning the slew rate is lower and does not need to be controlled as much by pulsing and spacing the pulses apart.

Eventually, following the third pulse ending at time T15 (at around 3.8 μs), the capacitor 108 and the ballast capacitor 120 fully discharge, and the current in the trace 204 drops to 0 A at around 4.17 μs. At this point, the capacitor 108 and the ballast capacitor 120 are fully discharged, and the voltage of the trace 206 stops decreasing and returns close to 0 V. By returning to close to 0 V, this allows another voltage charging pulse to be applied to the capacitor 108 in order to dispense further droplets of ink.

As such, this pulse including charging and discharging allows droplets of ink to be dispensed from the nozzles, while bringing the voltage back down to permit a subsequent pulse for another cycle of ink ejection.

Analogously to the charging, the trace 310 in FIG. 3 shows the plurality of voltage pulses applied to the inductor 110 as a consequence of the discharging switching pulses in the trace 208. The capacitor 108 and the ballast capacitor 120 effectively provide a voltage source to supply the voltage pulses to the inductor 110 when the second switch 114 is closed.

As with the charging, a plurality of switching voltage pulses can be used to repeatedly turn the second switch 114 on and off over a single discharging time period for the capacitor 108 and the ballast capacitor 120. The closing of the second switch 114 allows the capacitor 108 and the ballast capacitor 120 to provide a plurality of voltage pulses to the inductor 110 which are distributed over the discharge interval, allowing control over the slew rate of discharge. The opening and closing of the second switch 114 allows the capacitor 108 and the ballast capacitor 120 to discharge in a plurality of discharging voltage pulses which are applied to the inductor 110. This is in contrast to conventional discharging which occurs in a single pulse. This operation of the drive circuit 100 allows the discharging of the capacitor 108 and the ballast capacitor 120 to be distributed in a plurality of discrete pulses. By spacing the discharge over time, the slew rate (the discharging rate of the capacitor 108 and the ballast capacitor 120) can be controlled.

By providing a plurality of pulses in this way, the slew rate can be controlled. In particular, the spacing between the pulses of the trace 208 determines how quickly the capacitor 108 and the ballast capacitor 120 are discharged, and how quickly the voltage drops. Therefore, the spacing between the pulses can be controlled to provide the desired slew rate. FIG. 2 shows how a consistent slew rate can be achieved in the discharge voltage of the trace 206.

The ratio of the total on-time of the second switch 114 (in other words, the combined width of the pulses) to the combined capacitance of the capacitor 108 and the ballast capacitor 120 determines the drop in voltage achieved. This can be chosen to ensure the voltage returns close to 0 V. Therefore, the width of the pulses can be adjusted to provide the desired drop in voltage for a given capacitance. For example, when the capacitance reduces because fewer nozzles are active, the width of the pulses can be reduced to provide a consistent drop in voltage in spite of the change in capacitance.

Thus, in accordance with the first embodiment, pulse width modulation (PWM) can be used to supply a plurality of voltage pulses to an inductor to form a single charge and discharge of a printhead capacitance. The width and spacing of the pulses can be controlled to desirably affect the slew rate and provide for a consistent pulse shape, or account for a change in printhead capacitance.

The number of pulses can also be adjusted. The number of pulses in the first embodiment is for exemplary purposes only, and different numbers of pulses may be used in other embodiments.

Figure 4:
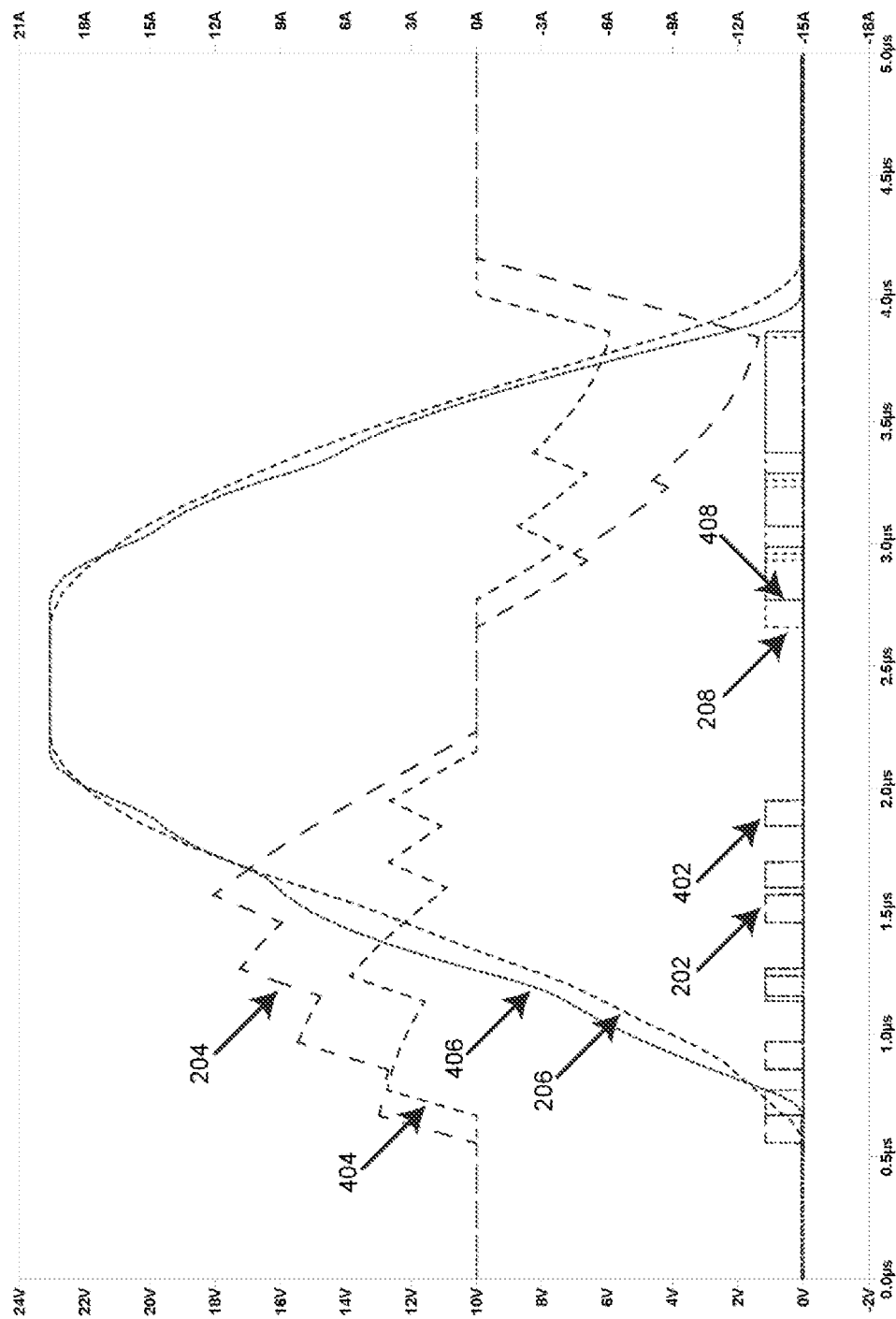
FIG. 4 shows traces of the switching pulses, the inductor currents, and the output voltage for two different capacitances (200 nF and 500 nF) when the drive circuit of the first embodiment is operated.

Referring to FIG. 4, adjusting the switching pulses for different printhead capacitances will now be described.

FIG. 4 shows the same traces of FIG. 2, where the capacitor 108 having a capacitance of 300 nF, with the ballast capacitor 120 having a capacitance of 200 nF, providing a total capacitance of 500 nF. The same reference numerals are used to indicate the same traces from FIG. 2.

FIG. 4 also includes a second set of traces, where the total capacitance is 200 nF. In particular, FIG. 4 shows a trace 402 representing the switching voltage pulses to the first switch 112. A trace 404 shows the current through the inductor 110. A trace 406 shows the voltage across the capacitor 108 and the ballast capacitor 120 (having a total capacitance of 200 nF). A trace 408 shows the switching voltage pulses to the second switch 114.

The pulse widths and spacing of the switching pulses for the 200 nF (i.e. the traces 402 and 408 in FIG. 4) are adjusted to provide a pulse shape of the charging voltage of the capacitor 108 and the ballast capacitor 120 in the trace 406 which is consistent with the 500 nF pulse in the trace 206. In particular, the maximum voltage is consistent at about 23 V, and the rising and falling slew rates for charging and discharging are consistent. As shown in FIG. 4, the drive circuit of the present disclosure allows the voltage pulse to be shaped as desired, for example by ensuring consistent pulse shapes for different printhead capacitances. As demonstrated, the slew rate can be controlled over a wide range of capacitances to provide the desired pulse shape.

Figure 5:
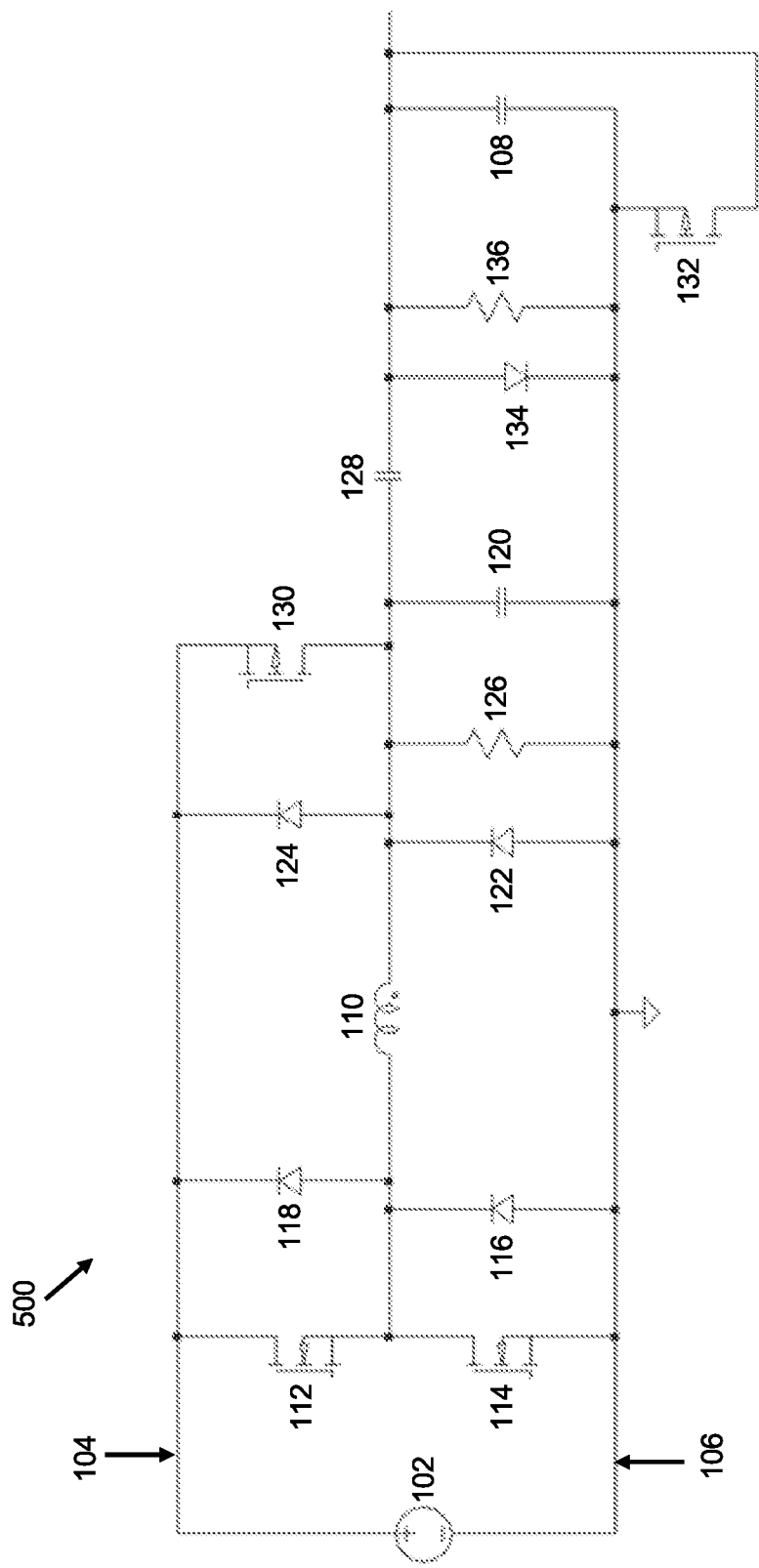
FIG. 5 shows a schematic diagram of a drive circuit according to a second embodiment of the present disclosure.

Referring to FIG. 5, a drive circuit 500 according to a second embodiment of the present disclosure is provided. The drive circuit 500 comprises all of the features of the drive circuit 100 of the first embodiment, and the same reference numerals are used to indicate identical elements.

The drive circuit 500 further comprises a third capacitor 128. The third capacitor 128 is connected between the inductor 110 and the capacitor 108. The third capacitor 128 is connected between the capacitor 108 and the ballast capacitor 120. The third capacitor 128 has a capacitance which is large compared to the combined capacitance of the capacitor 108 representing the printhead capacitance and the ballast capacitor 120.

The drive circuit 500 further comprises a third switch 130. In the second embodiment, the third switch 130 is a MOSFET transistor. The third switch 130 is connected between the supply rail 104 and the third capacitor 128, in particular connected from the supply rail 104 to a point between the third capacitor 128 and the inductor 110. Thus, the third switch 130 is connected in parallel with the fourth diode 124.

The drive circuit 500 further comprises a fourth switch 132. In the second embodiment, the fourth switch 132 is a MOSFET transistor. The fourth switch 132 is connected between the ground rail 106 and the third capacitor 128, in particular on the side of the third capacitor 128 connected to the printhead capacitor 108. Thus, the fourth switch 132 is connected in parallel with the capacitor 108 representing the printhead capacitance.

The drive circuit 500 further comprises a fifth diode 134. The fifth diode 134 is connected between the ground rail 106 and the third capacitor 128, in particular on the side of the third capacitor 128 connected to the printhead capacitor 108. The fifth diode 134 is thus arranged in parallel with the capacitor 108 and the fourth switch 132. The fifth diode 134 is connected to permit current flow only in the direction from the third capacitor 128 to the ground rail 106, and hence prevents current flow in the direction from the ground rail 106 to the third capacitor 128. In other words, the fifth diode 134 is forward biased relative to the polarity of the power supply 102.

The drive circuit 500 further comprises a second resistor 136. The second resistor 136 is connected between the ground rail 106 and the third capacitor 128, in particular on the side of the third capacitor 128 connected to the printhead capacitor 108. The second resistor 136 is thus arranged in parallel with the capacitor 108, the fourth switch 132, and the fifth diode 134.

Generally, the drive circuit 500 generates an upside-down pulse which is level shifted by the third capacitor 128. This can be used to invert the polarity of the output signal for charging the capacitor 108 of the printhead and the ballast capacitor 120, in conjunction with an appropriate order of switching. The third switch 130 and the fourth switch 132 act as clamps to define the relevant voltages for inverting the polarity.

Initially, the third switch 130 and the fourth switch 132 are closed. This allows current to flow out of the power supply 102 from the supply rail 106, through the third switch 130 and to charge the third capacitor 128 through the fourth switch 132 to the ground rail 106. This ensures that the third capacitor 128 is in a known state (i.e. fully charged to the voltage of the supply rail 106). This also ensures that no current flows through the inductor 110.

In operation, the third switch 130 and the fourth switch 132 are opened, and at the same time the second switch 114 is closed (pulsed as described above) to make a negative-going edge (i.e. a charging pulse, but negative in polarity). In other words, current begins to flow out of the third capacitor 128, through the inductor 110, and through the second switch 114 towards the ground rail 106. This discharges the third capacitor 128, and makes the output voltage across the capacitor 108 and the ballast capacitor 120 drop to negative.

The first switch 112 can then be closed (pulsed as described above) to return the pulse voltage back to 0 V (i.e. discharging by increasing back to 0 V). Current can then begin to flow from the power supply 102, through the first switch 112, through the inductor 110, through the capacitor 108 and the ballast capacitor 120, and towards the ground rail 106. This makes the output voltage across the capacitor 108 and the ballast capacitor 120 rise back to 0 V.

This allows a charging/discharging pulse to be generated as described above in relation to the first embodiment, but where the generated pulse is negative in polarity.

In other embodiments, the drive circuit may further comprise a second inductor. For example, the second inductor may be arranged in parallel with the inductor 110. The second inductor may be switched to connect instead of, or as well as, the inductor 110. This can enable to the second inductor to provide a different value of inductance from the inductor 110. The drive circuit may comprise further inductors which can be used to provide varying inductances. By switching between the discrete inductances, the combination of those inductance values can be provided. Furthermore, by appropriate switching between two inductors (e.g. one which is too large, and one which is too small), the effect of an intermediate sized inductor can be provided.

In accordance with the present disclosure, the shape of the pulse used to charge and discharge the printhead can be controlled. The rise and fall slew rates control the current flow in the printhead to the piezo actuators via the on-head driver transistors. If the rise or fall slew rates are too high, the current may exceed the safe limits for the head driver transistors and/or the conductive traces leading to the actuators, so reducing the operating life of the head. If the slew rates are too low, droplet velocity may be reduced, and the waveform takes a longer time, thereby reducing maximum operating frequency. Control over the shape of the pulse allows this to be controlled. In one example, the pulse can be controlled to accurately replicate an exemplary waveform provided by the printhead manufacturer.

Printheads may exhibit crosstalk when adjacent nozzles are affected by the charging of individual nozzles, which may lead to decreased performance of droplet velocity and drop mass. Droplet velocity and drop mass may both be a function of how many jets are firing. This variation of droplet velocity and mass reduces image quality, compared to constant values. By deliberately altering voltage amplitude and/or pulse width as a function of the number of jets firing, the crosstalk can be compensated, potentially for both mass and velocity at the same time, but at least for one of them. Preferably, the crosstalk is measured in the final print system, so that the system can be best calibrated. Alternatively, generic values of crosstalk can be used. Droplet velocity is important because it affects final dot position, so the most effective way of calibrating is to measure dot positions. Thus, control over the slew rates and the pulse shape in accordance with the present application can also allow for improvements in crosstalk.

In other embodiments, the inductor may be replaced with a multi-tap transformer. This allows different values of inductance to be switched in and out to maintain slew rate over a range of head capacitance values (jets firing). This also allows for polarity reversal.

The invention claimed is:

1. A drive circuit for charging a printhead for ejecting drops of ink, the printhead having a capacitance, the drive circuit comprising:
   i. a power supply comprising a first connection and a second connection;
   ii. an inductor connected to the first connection of the power supply;

iii. wherein the inductor is connected to a first drive connection of the printhead to provide a charge path for current to charge the capacitance;

iv. wherein the second connection of the power supply is connected to a second drive connection of the printhead; and v. wherein the drive circuit is configured to apply a plurality of charging voltage pulses to the inductor to provide a single charge of the capacitance for a single cycle of ink ejection from the printhead;

further comprising a first circuit element which permits current flow in only one direction, wherein the first circuit element is connected in series between the second connection of the power supply and a first connection of the inductor, wherein the first connection of the inductor is connected to the first connection of the power supply, and wherein the first circuit element is configured to permit current flow only in the direction from the second connection of the power supply to the first connection of the inductor;

wherein the plurality of charging voltage pulses comprises a first charging voltage pulse and a second charging voltage pulse, wherein the second charging voltage pulse is applied while current is still flowing through the inductor into the capacitance via the first circuit element following the first charging voltage pulse.

2. The drive circuit according to claim 1, wherein the plurality of charging voltage pulses are provided within a time period for a single charge of the capacitance.

3. The drive circuit according to claim 1, wherein the drive circuit is configured to adjust a total on-time of the charging voltage pulses.

4. The drive circuit according to claim 3, wherein the adjusting the total on-time of the charging voltage pulses is based on the capacitance of the printhead.

5. The drive circuit according to claim 1, wherein the drive circuit is configured to adjust a time between the charging voltage pulses.

6. The drive circuit according to claim 5, wherein the adjusting the time between the charging voltage pulses is based on the capacitance of the printhead.

7. The drive circuit according to claim 1, further comprising a first switching element connected in series between the first connection of the power supply and a first connection of the inductor, wherein the first connection of the inductor is connected to the first connection of the power supply.

8. The drive circuit according to claim 7, wherein the drive circuit is configured to repeatedly close and open the first switching element to cause the power supply to provide the plurality of charging voltage pulses to the inductor, and wherein when the first switching element is closed a charge path for current is provided to charge the capacitance through the inductor.

9. The drive circuit according to claim 1, wherein the first circuit element is configured to provide a charge path for current from the inductor to charge the capacitance in between the plurality of charging voltage pulses.

10. The drive circuit according to claim 1, wherein the drive circuit is configured to enable a plurality of discharging voltage pulses to be applied to the inductor to provide a single discharge of the capacitance.

11. The drive circuit according to claim 10, wherein the drive circuit is configured to adjust a total on-time of the discharging voltage pulses.

12. The drive circuit according to claim 11, wherein the adjusting the total on-time of the discharging voltage pulses is based on the capacitance of the printhead.

13. The drive circuit according to claim 10, wherein the drive circuit is configured to adjust a time between the discharging voltage pulses.

14. The drive circuit according to claim 13, wherein the adjusting the time between the discharging voltage pulses is based on the capacitance of the printhead.

15. The drive circuit according to claim 1, further comprising a second switching element connected in series between the second connection of the power supply and a first connection of the inductor, wherein the first connection of the inductor is connected to the first connection of the power supply.

16. The drive circuit according to claim 15, wherein the drive circuit is configured to repeatedly close and open the second switching element to cause the capacitance to provide the plurality of discharging voltage pulses to the inductor, and wherein when the second switching element is closed a discharge path for current is provided to discharge the capacitance through the inductor.

17. The drive circuit according to claim 1, further comprising a second circuit element which permits current flow in only one direction, wherein the second circuit element is connected in series between a first connection of the inductor and the first connection of the power supply, wherein the first connection of the inductor is connected to the first connection of the power supply, and wherein the second circuit element is configured to permit current flow only in the direction from the first connection of the inductor to the first connection of the power supply.

* * * * *